(12) United States Patent
Nakashiba

(10) Patent No.: US 6,310,933 B1
(45) Date of Patent: Oct. 30, 2001

(54) CHARGE TRANSFERRING DEVICE AND CHARGE TRANSFERRING METHOD WHICH CAN REDUCE FLOATING DIFFUSION CAPACITANCE

(75) Inventor: Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/177,969

(22) Filed: Oct. 26, 1998

(30) Foreign Application Priority Data

Oct. 31, 1997 (JP) ...................................................... 9-316561

(51) Int. Cl.$^7$ .......................... G11C 19/28; H01L 29/768
(52) U.S. Cl. ............................... 377/60; 257/239; 257/224
(58) Field of Search ................................ 257/239; 377/60

(56) References Cited

U.S. PATENT DOCUMENTS

| | | | | |
|---|---|---|---|---|
| 4,698,656 | * | 10/1987 | Kamata | 257/239 |
| 5,191,398 | * | 3/1993 | Mutoh | 257/239 |
| 5,498,887 | * | 3/1996 | Ohki et al. | 257/239 |

FOREIGN PATENT DOCUMENTS

| | | |
|---|---|---|
| 1-502634 | 9/1989 | (JP) . |
| 4-23334 | 1/1992 | (JP) . |
| 4-180676 | 6/1992 | (JP) . |
| 7-22612 | 1/1995 | (JP) . |
| 8-21709 | 3/1996 | (JP) . |

OTHER PUBLICATIONS

W.F. Kosonocky et al. "Two–Phase Charge Coupled Devices with Overlapping Polysilicon and Aluminum Gates", RCA Review vol. 34, Mar. 1973, pp. 164–201.

* cited by examiner

Primary Examiner—Gene M. Munson
(74) Attorney, Agent, or Firm—Sughrue, Mion, Zinn, Macpeak & Seas, PLLC

(57) ABSTRACT

A charge transferring device includes a detection MOSFET for detecting a signal charge, a reset MOSFET for removing the signal charge after the signal charge is detected. The reset MOSFET includes a floating diffusion layer to which the signal charge is transferred, an impurity layer to which a reset voltage is applied, and a reset gate electrode to which a reset signal is supplied. The detection MOSFET includes a detection gate electrode connected with the floating diffusion layer. The floating diffusion layer includes a first semiconductor region and a second semiconductor region whose impurity concentration is lower than that of the first semiconductor region. The impurity concentration of the first semiconductor region is set to a concentration such that the first semiconductor region is not depleted in a voltage lower than the reset voltage when the reset signal is supplied to the reset gate electrode.

12 Claims, 10 Drawing Sheets

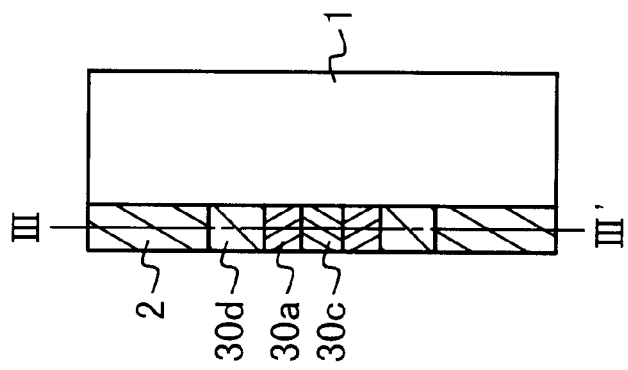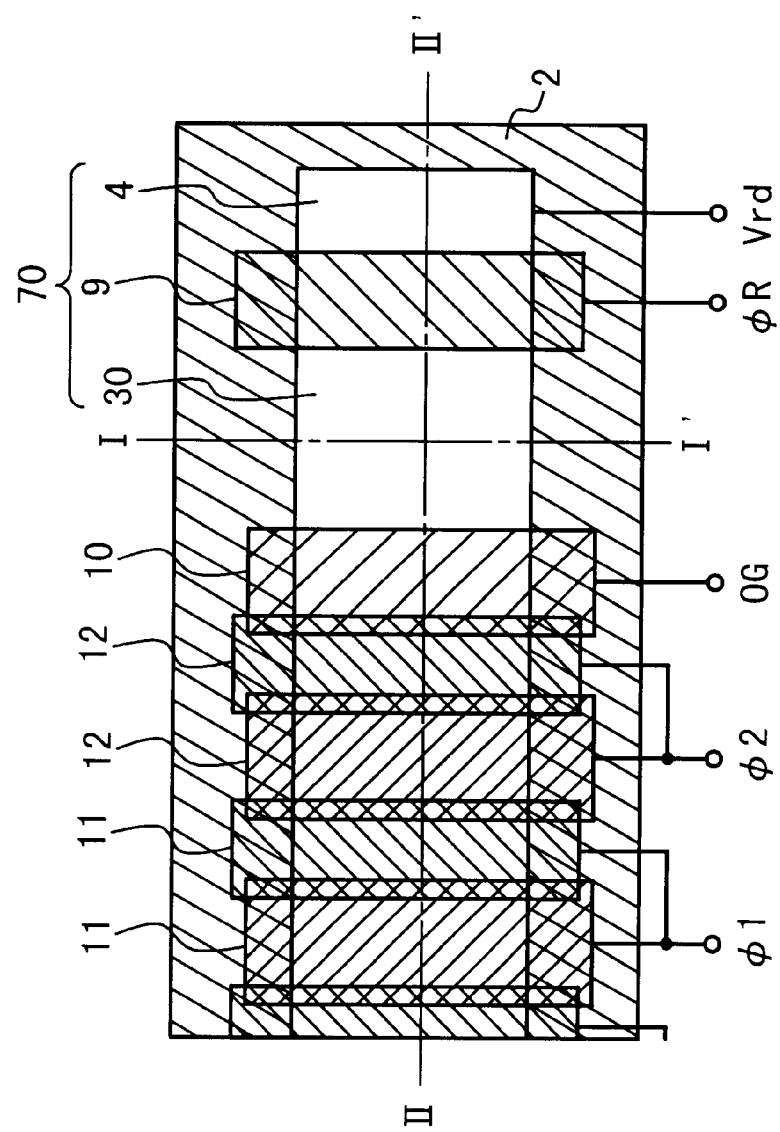

CHARGE TRANSFERRING DEVICE AND CHARGE TRANSFERRING METHOD WHICH CAN REDUCE FLOATING DIFFUSION CAPACITANCE

BACKGROUND OF THE INVENTION

1. Field of the Invention

The present invention relates to a charge transferring device and a charge transferring method. More particularly, the present invention relates to a charge transferring device and a charge transferring method which have a floating diffusion layer that can reduce a floating diffusion capacitance.

2. Description of the Related Art

Conventionally, a charge transferring device has been well known which has a floating diffusion amplifier composed of a reset MOSFET with a floating diffusion layer and a detection MOSFET that has a gate electrode connected to this floating diffusion layer and constitutes a detection circuit. For example, refer to ("Two Phase Charge Coupled Devices with Overlapping Polysillicon and Aluminum Gates", Kosonocky, W. F. and Carnes, J. E., RCA Review Vol. 34, pp. 164–201, 1973) and the like.

The charge transferring device having this floating diffusion amplifier will be described below with reference to FIGS. 1A, 1B, 2 and 3. FIG. 1A is a plan view of a floating diffusion layer containing a transferring section of the charge transferring device and the reset MOSFET. FIG. 1B is a view diagrammatically showing a section taken on the line I–I' of FIG. 1A. FIG. 2 is a view diagrammatically showing a section taken on the line II–II' of FIG. 1A. And, FIG. 3 is a view diagrammatically showing a section taken on the line III–III' of FIG. 1B.

In FIGS. 1A, 1B, 2 and 3, a reference number 1 denotes a P-type semiconductor substrate. Similarly, a reference number 2 denotes a high concentration P$^+$-type semiconductor element separating region having the same conductive type as the P-type semiconductor 1. A reference number 300 denotes a floating diffusion layer. A reference number 4 denotes an N$^+$-type semiconductor region connected to a reset power supply Vrd. A reference number 5 denotes a gate electrode of a detection MOSFET of a detection circuit K connected to the floating diffusion layer 300. A reference number 6 denotes a gate electrode of a depletion type load MOSFET of the detection circuit K. A reference number 7 denotes an N-type semiconductor region of a known two-phase driving type charge transferring device. A reference number 8 denotes an N$^-$-type semiconductor region having the same conductive type as the N-type semiconductor region 7 to protect a signal charge from being transferred to the reverse direction of the two-phase driving type charge transferring device. A reference number 9 denotes a reset gate electrode to which a reset pulse voltage $\phi$R is applied. A reference number 10 denotes a gate electrode to which a low voltage is applied as an output end of the charge transferring device. A reference number 11 is a charge transfer electrode formed of two-layer polycrystal silicon film to which a charge transfer pulse voltage $\phi$1 is applied. A reference number 12 is a charge transfer electrode formed of two-layer polycrystal silicon film to which a charge transfer pulse voltage $\phi$2 is applied. A reference number 13 denotes a drain power supply Vd of the detection circuit K. And, a reference number 14 denotes a signal output terminal Vout.

Operations of the charge transferring device having the floating diffusion amplifier will be described below. Immediately before a signal charge is transferred from the charge transferring device to the floating diffusion layer 300, a high level of the reset pulse voltage $\phi$R is always applied to the reset gate electrode 9. Accordingly, the floating diffusion layer 300 is reset to the reset voltage Vrd. After the reset pulse voltage $\phi$R is returned back to a low level, the voltage level of the charge transfer electrode 12 changes from a high level to a low level. Then, the signal charge is transferred to the floating diffusion layer 300.

If a whole capacitance containing the gate electrode 5 of the detection MOSFET connected to the floating diffusion layer 300 is Cfd and the signal charges transferred to the floating diffusion layer 300 is Qsig, a potential change $\Delta$Vfd=Qsig/Cfd is generated in the floating diffusion layer 300. Then, the potential change $\Delta$Vfd changes the voltage of the gate electrode 5 of the detection MOSFET in the detection circuit K. The potential change $\Delta$Vfd proportional to the transferred signal charges Qsig is detected in the signal output terminal Vout 14 of the detection circuit K.

In order to increase a detection sensitivity, it is necessary to reduce the floating diffusion capacitance Cfd. Japanese Laid Open Patent Application,(JP-A-Heisei 4-23334) discloses that the impurity concentration of the floating diffusion layer 300 decreases with the decrease of the junction capacitance between the floating diffusion layer 300, and one of the P-type semiconductor substrate 1, the P$^+$-type semiconductor region (the element separating region)2 surrounding the floating diffusion layer 300, the reset gate electrode 9, and the gate electrode 10.

However, in this case if the impurity concentration of the floating diffusion layer 300 is extremely low, the floating diffusion layer 300 is depleted in a voltage lower than the reset power supply voltage Vrd. Thus, the floating diffusion layer 300 is reset to the voltage lower than the reset power supply voltage Vrd. That is, a reset fault is generated. Therefore, it is necessary to adjust the impurity concentration of the floating diffusion layer 300.

For this reason, Japanese Examined Open Patent Application,(JP-B-Heisei 8-21709) discloses that the floating diffusion layer 300 is provided with a first N-type semiconductor region 300$a$ and a second N-type semiconductor region 300$b$ having a concentration higher than that of the first N-type semiconductor region 300$a$ as described below. That is, the impurity concentration of the first N-type semiconductor region 300$a$ is set to a low impurity concentration at which the first N-type semiconductor region 300$a$ is not substantially depleted when the voltage $\phi$R is applied to the reset gate electrode 9 (for example, an impurity concentration of about $1 \times 10^{17}$ atoms/cm$^3$) The second N-type semiconductor region 300$b$ is provided to be connected to the gate electrode 5 of the detection circuit K by using a metallic wire. The impurity concentration of the second N-type semiconductor region 300$b$ is set to be higher than that of the first N-type semiconductor region 300$a$ (for example, an impurity concentration of about $1 \times 10^{19}$ atoms /cm$^3$)

In FIGS. 1A, 1B, 2 and 3, the impurity concentration of the first N-type semiconductor region 300$a$ is suppressed in a range in which the floating diffusion layer 300 is not depleted in the voltage lower than the reset power supply voltage Vrd. Thus, it is possible to suppress the junction capacitance between the floating diffusion layer 300 and the P-type semiconductor substrate 1, the junction capacitance between the floating diffusion layer 300, and one of the element separating region (the P$^+$-type semiconductor region) 2 and the reset gate electrode 9, and the gate electrode 10. Therefore, the whole floating diffusion capacitance Cfd of the floating diffusion layer 300 is reduced.

The second N-type semiconductor region 300b whose impurity concentration is higher than that of the first N-type semiconductor region 300a is formed in FIGS. 1A, 1B, 2 and 3. For the reason, even if an alloy heat treatment of aluminum as the metallic wire is sufficiently performed in a connection section 5a to the metallic wire, P-N junction leak is never generated in a portion below the connection section 5a. Moreover, the high concentration layer is limited to a narrow region of only the second N-type semiconductor region 300b. Therefore, there is no possibility of the large increase in the junction capacitance (the floating diffusion capacitance) Cfd of the floating diffusion layer 300.

However, the conventional charge transferring device having the floating diffusion amplifier has problems described below.

As mentioned above, in the conventional charge transferring device having the floating diffusion amplifier, there is a case that the impurity concentration of the floating diffusion layer 300 is extremely low. Especially, the impurity concentration of the first N-type semiconductor region 300a constituting the floating diffusion layer 300 is extremely low. In this case, the floating diffusion layer 300 is depleted in the voltage lower than the reset power supply voltage Vrd. The depletion leads to the generation of the reset fault. Therefore, it is necessary to set the suitable impurity concentration.

For example, if the impurity concentration of the P-type semiconductor substrate 1 is assumed to be about $1 \times 10^{16}$ atoms/cm$^3$ and the reset power supply voltage Vrd is assumed to be 15 V, it is necessary to set the impurity concentration of the first N-type semiconductor region 300a constituting the floating diffusion layer 300 to be equal to or higher than about $1 \times 10^{16}$ atoms/cm$^3$.

For the reason, there is a limit on the trial of reducing the impurity concentration of the floating diffusion layer 300 to increase the detection sensitivity.

SUMMARY OF THE INVENTION

The present invention has been made to solve the above-described problems. Therefore an object of the present invention is to provide a charge transferring device which can reduce the floating diffusion capacitance.

Another object is to provide a charge transferring device which can increase a detection sensitivity.

Still another object is to provide a charge transferring device which can prevent a reset fault from being generated.

Yet still another is to provide a charge transferring device which can obtain ohmic contact with a metallic wire for the connection to a gate electrode of a detection MOSFET.

In order to achieve an aspect of the prevent invention, a charge transferring device includes a detection MOSFET for detecting a signal charge, a reset MOSFET for removing the signal charge after the signal charge is detected, wherein the reset MOSFET includes a floating diffusion layer to which the signal charge is transferred, an impurity layer to which a reset voltage is applied, and a reset gate electrode to which a reset signal is supplied, and wherein the detection MOSFET includes a detection gate electrode connected with the floating diffusion layer, and wherein the floating diffusion layer includes a first semiconductor region and a second semiconductor region whose impurity concentration is lower than that of the first semiconductor region, and wherein the impurity concentration of the first semiconductor region is set to a concentration such that the first semiconductor region is not depleted in a voltage lower than the reset voltage when the reset signal is supplied to the reset gate electrode.

In order to achieve another aspect of the present invention, in the charge transferring device, the first semiconductor region is provided without being in contact with an element separating region, and the second semiconductor region is provided with being in contact with the element separating region.

In order to achieve still another aspect of the present invention, in the charge transferring device, the impurity concentration of the second semiconductor region is set to a concentration such that the second semiconductor region is depleted when the reset signal is supplied to the reset gate electrode.

In this case, the first semiconductor region is provided to extend in a transfer direction of the signal charge, in the floating diffusion layer.

In order to achieve yet still another aspect of the present invention, the charge transferring device further includes a third semiconductor region whose impurity concentration is higher than that of the first semiconductor region, and wherein the detection gate electrode is connected with the third semiconductor region.

In this case, in the charge transferring device, the reset voltage is set to a value such that a part of the first semiconductor region and an entire portion of the second semiconductor region are depleted when the reset signal is supplied to the reset gate electrode.

Also in this case, in the charge transferring device, the first semiconductor region and the second semiconductor region are equal to each other in conductive type.

Further, in the charge transferring device, the first semiconductor region and the second semiconductor region may be opposite to each other in conductive type.

In this case, in the charge transferring device, the first semiconductor region, the second semiconductor region and the third semiconductor region may be equal to each other in conductive type.

Also in this case, in the charge transferring device, the first semiconductor region and the third semiconductor region may be equal to each other in conductive type, and a conductive type of the second semiconductor region is opposite to those of the first semiconductor region and the third semiconductor region.

In order to another aspect of the present invention, a charge transferring device includes a detection MOSFET for detecting a signal charge, a reset MOSFET for removing the signal charge after the signal charge is detected, wherein the reset MOSFET includes a floating diffusion layer to which the signal charge is transferred, an impurity layer to which a reset voltage is applied, and a reset gate electrode to which a reset signal is supplied, and wherein the detection MOSFET includes a detection gate electrode connected with the floating diffusion layer, and wherein the floating diffusion layer includes a first semiconductor region, a second semiconductor region whose impurity concentration is lower than that of the first semiconductor region and a third semiconductor region whose impurity concentration is higher than that of the first semiconductor region, and wherein the first semiconductor region is provided without being in contact with an element separating region, and is provided to extend in a transfer direction of the signal charge, in the floating diffusion layer, and an impurity concentration of the first semiconductor region is set to a concentration such that the first semiconductor region is not depleted in a voltage lower than the reset voltage when the reset signal is supplied to the reset gate electrode, and wherein the second semiconductor region is provided to be in contact with the element separating region, and wherein the third semiconductor region is provided near the center of the floating diffusion layer such that at least a part of the third semiconductor region overlaps with the first semiconductor region, and is connected to the detection gate electrode.

In order to achieve still another aspect of the present invention, a charge transferring method includes the steps of forming a well in response to a reset signal such that the well has a predetermined potential and has an area smaller than that of a floating diffusion layer, transferring a signal charge to the well and detecting the signal charge transferred to the well.

In order to achieve yet still another aspect of the present invention, a charge transferring method includes the steps of forming a floating diffusion layer with first and second semiconductor regions, forming a well having a predetermined potential in the floating diffusion layer in response to a reset signal and depleting the first semiconductor region in a potential lower than the predetermined potential in response to the reset signal.

In this case, the charge transferring method further includes the step of depleting a part of the second semiconductor region in a potential lower than the predetermined potential in response to the reset signal.

In order to achieve another aspect of the present invention, a charge transferring method includes the steps of providing a floating diffusion layer, forming a well having a capacitance lower than that of the floating diffusion layer and a predetermined potential in response to a reset signal, transferring a signal charge to the well and detecting the signal charge transferred to the well.

In this case, in the charge transferring method, the step of providing the floating diffusion layer includes providing the floating diffusion layer which has first and second semiconductor regions whose impurity concentrations are different from each other, and wherein the step of forming the well includes depleting the first semiconductor region in a potential lower than the predetermined potential.

Also, in this case, in the charge transferring method, wherein the step of providing the floating diffusion layer includes providing the floating diffusion layer which has first and second semiconductor regions whose impurity concentrations are different from each other, and wherein step of forming the well includes depleting an entire portion of the first semiconductor region and a part of the second semiconductor region in a potential lower than the predetermined potential.

In order to achieve still another aspect of the present invention, a charge transferring device includes means for setting a floating diffusion layer to a reset potential in response to a reset signal, means for forming a well corresponding to the reset potential in the floating diffusion layer, means for transferring a signal charge to the well, means for detecting the signal charge transferred to the well, means for reducing a floating diffusion capacitance in the floating diffusion layer and means for preventing the floating diffusion layer from being depleted in a potential lower than the reset potential.

In this case, in the charge transferring device, the means for reducing the floating diffusion capacitance includes a first semiconductor region provided without being in contact with an element separating region, and a second semiconductor region which is provided to be in contact with the element separating region and whose impurity concentration is set to be lower than that of the first semiconductor region, and wherein the first and second semiconductor regions are included in the floating diffusion layer.

Also, in the charge transferring device, the impurity concentration of the first semiconductor region is set to a concentration such that the first semiconductor region is not depleted in the potential lower than the reset potential, when the floating diffusion layer is set to the reset potential.

Further in this case, in the charge transferring device, the impurity concentration of the second semiconductor region is set to a concentration such that the second semiconductor region is depleted, when the floating diffusion layer is set to the reset potential.

In the charge transferring device, the impurity concentration of the first semiconductor region may be set to a concentration such that a part of the first semiconductor region is not depleted in the potential lower than the reset potential and a remaining part of the first semiconductor region is depleted, when the floating diffusion layer is set to the reset potential.

BRIEF DESCRIPTION OF THE DRAWINGS

For a better understanding of the present invention, reference is made of a detailed description to read in conjunction with the accompanying drawing, in which:

FIG. 8A is a plan view of a second embodiment of a charge transferring device of the present invention;

FIG. 8B is a section view taken on the line I–I' of FIG. 8A;

DESCRIPTION OF THE PREFERRED EMBODIMENTS

Referring now to drawings, a charge transferring device according to embodiments of the present invention will be described.

Figures 1A, 1B:
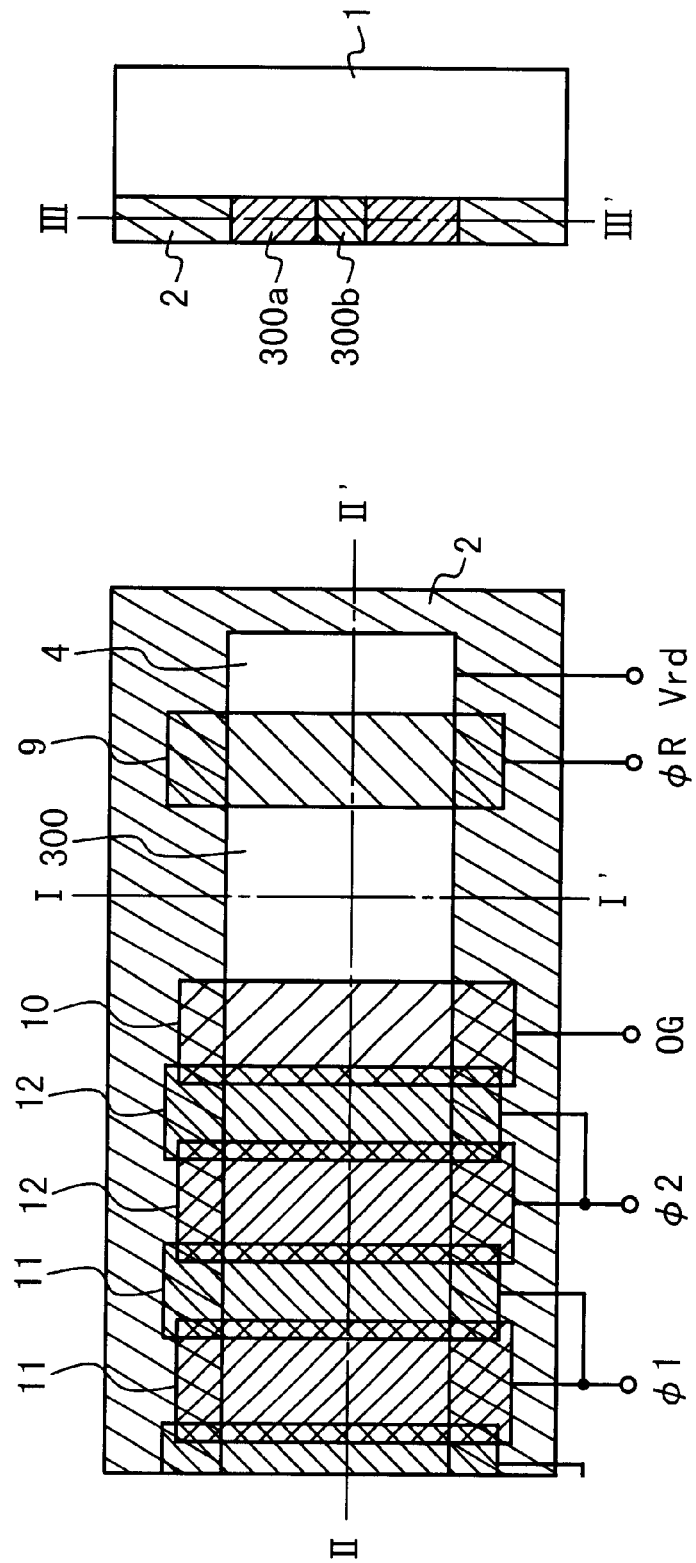
FIG. 1A is a plan view of an example of a conventional charge transferring device.
FIG. 1B is a section view taken on the line I–I' of FIG. 1A.
Figure 2:
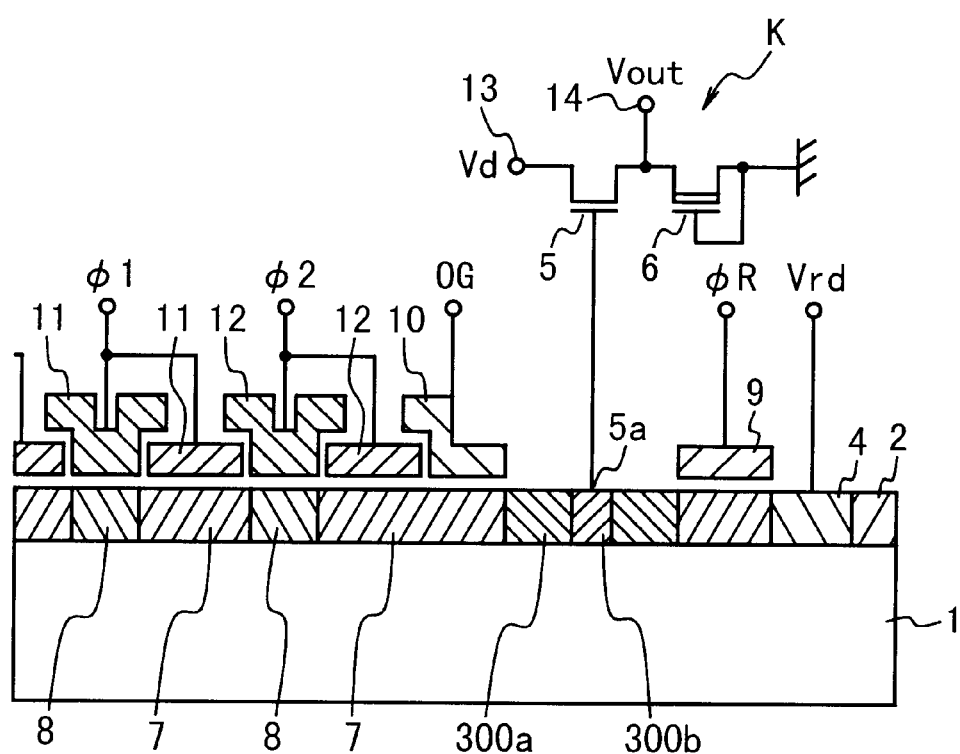
FIG. 2 is a section view taken on the line II–II' of FIG. 1A.
Figure 3:
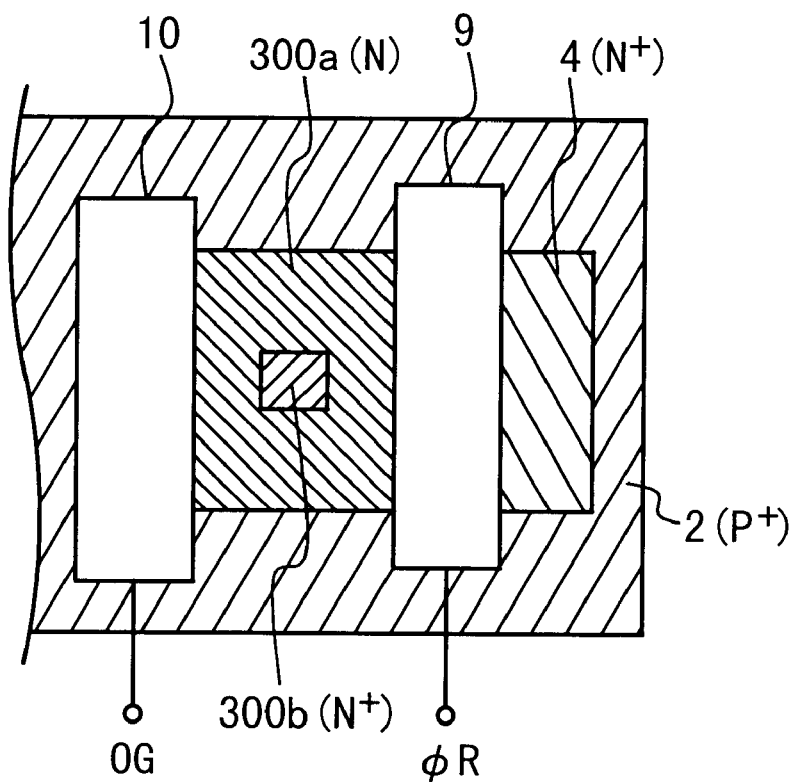
FIG. 3 is a plan section view taken on the line III–III' of FIG. 1B.
Figure 4A:
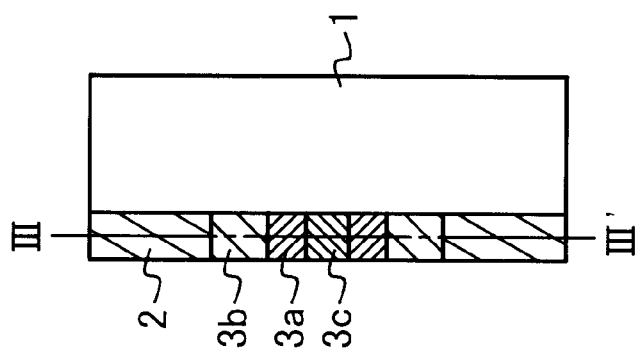
FIG. 4A is a plan view of a first embodiment of a charge transferring device of the present invention.
Figure 4B:
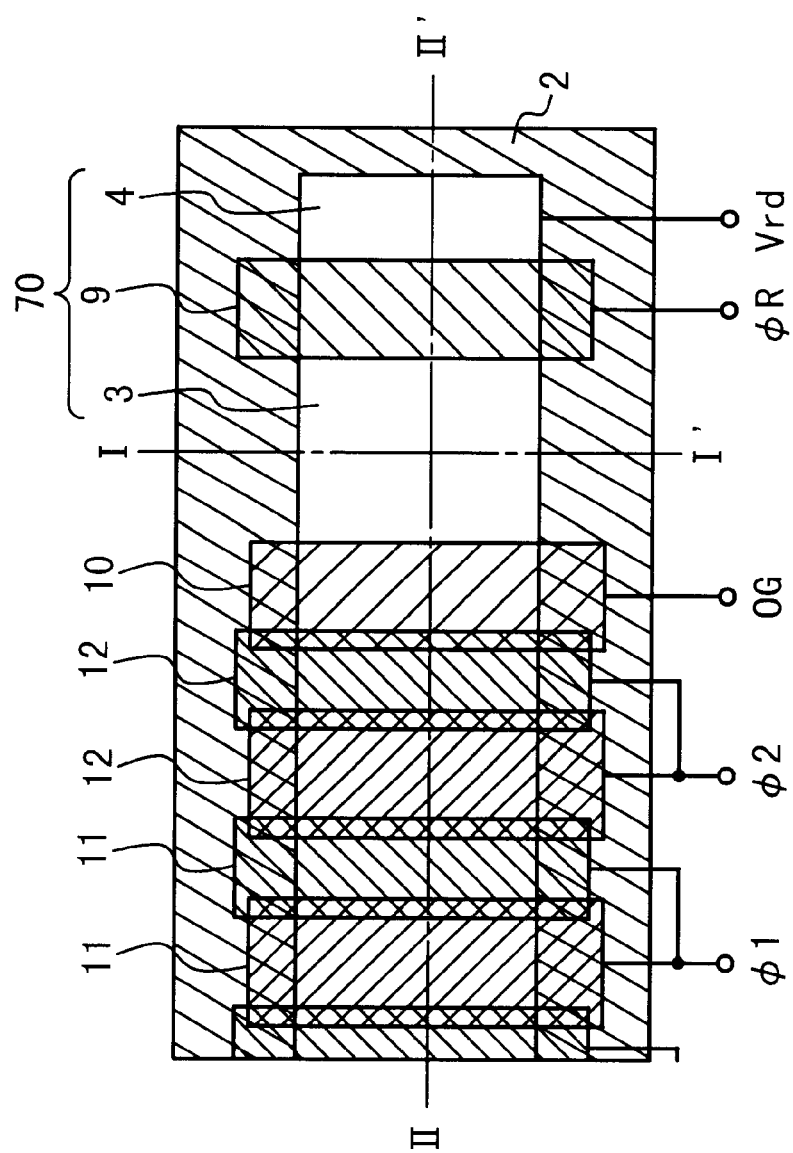
FIG. 4B is a section view taken on the line I–I' of FIG. 4A.
Figure 5:
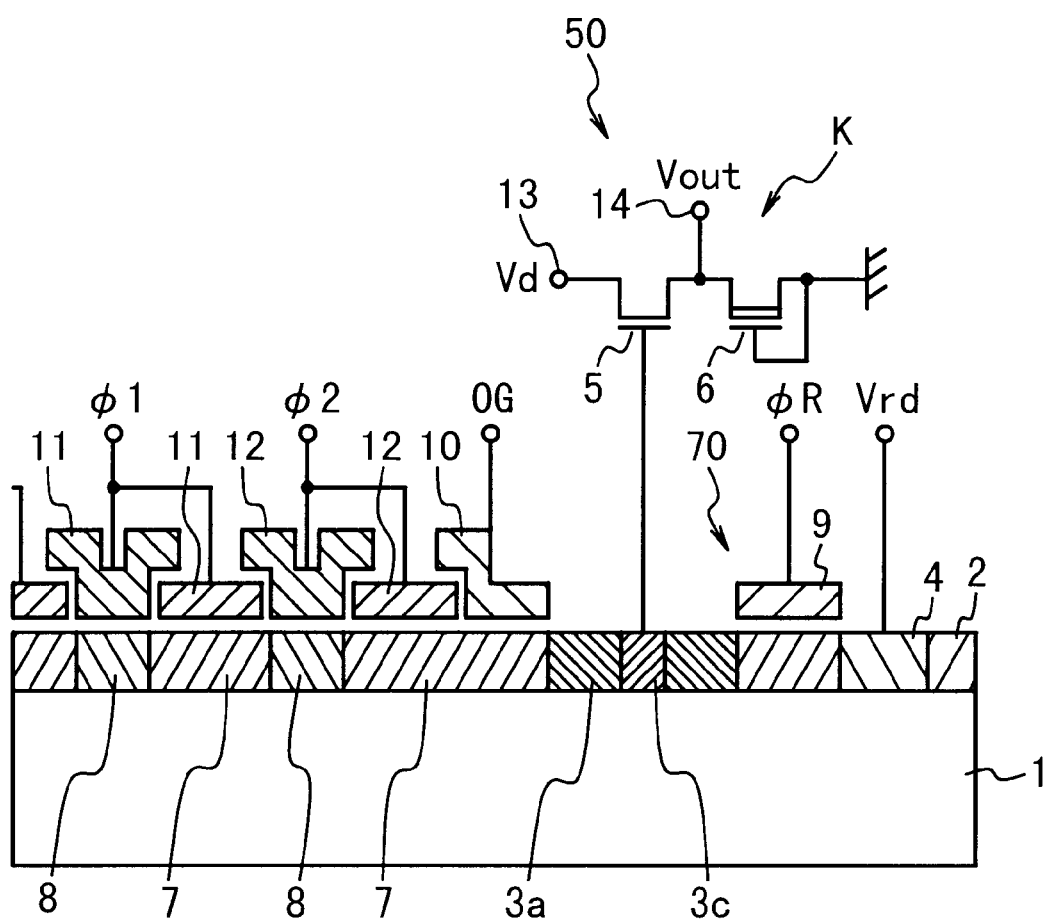
FIG. 5 is a section view taken on the line II–II' of FIG. 4A.
Figure 6:
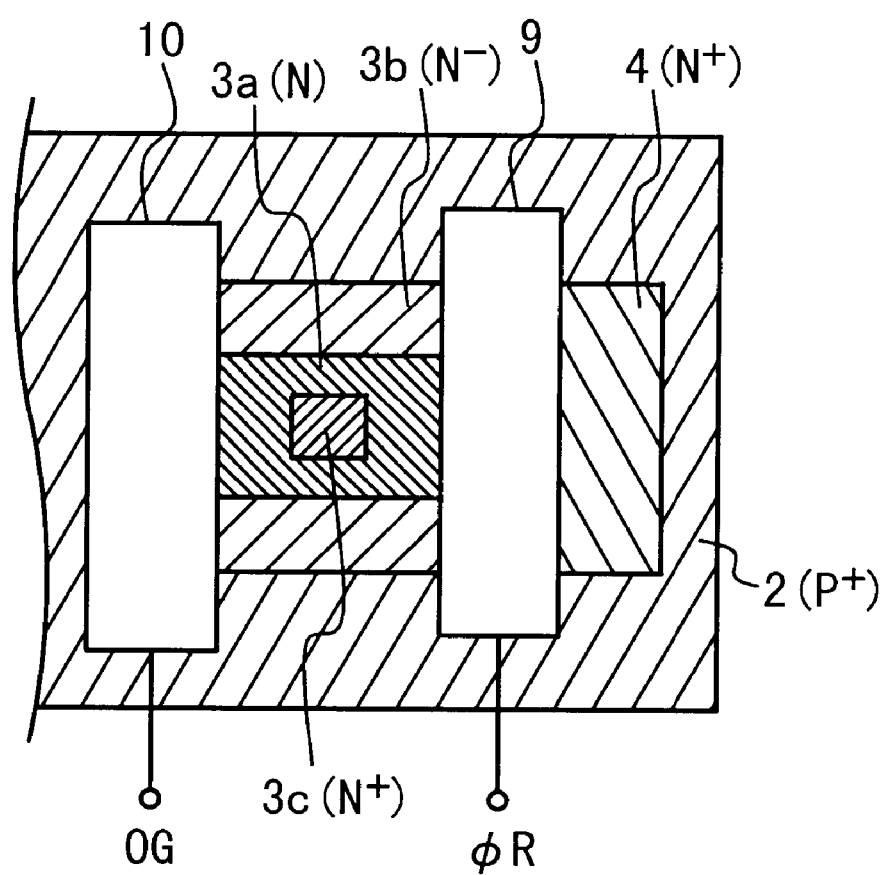
FIG. 6 is a plan section view taken on the line III–III' of FIG. 4B.

FIGS. 4A, 4B, 5 and 6 are views showing a first embodiment of the present invention. FIG. 4A is a plan view of a floating diffusion layer containing a transferring section of the charge transferring device and a reset MOSFET. FIG. 4B is a view diagrammatically showing a section taken on the line I–I' of FIG. 4A. FIG. 5 is a view diagrammatically showing a section taken on the line II–II' of FIG. 4A. And, FIG. 6 is a view diagrammatically showing a section taken on the line III–III' of FIG. 4B.

FIGS. 4A, 4B, 5 and 6 respectively correspond to FIGS. 1A, 1B, 2 and 3 in the explanation of the conventional charge transferring device. Every reference number used in FIGS. 4A, 4B, 5 and 6 corresponds to that used in FIGS. 1A, 1B, 2 and 6, respectively.

In FIGS. 4A, 4B, 5 and 6, a reference number 1 denotes a P-type semiconductor substrate. Similarly, a reference number 2 denotes a high concentration P$^+$-type semiconductor element separating region having the same conductive type as the P-type semiconductor 1. A reference number 3 denotes a floating diffusion layer. A reference number 4 denotes an N$^+$-type semiconductor region connected to a reset power supply Vrd. A reference number 5 denotes a gate electrode of a detection MOSFET of a detection circuit K connected to the floating diffusion layer 3. A reference number 6 denotes a gate electrode of a depletion type load MOSFET of the detection circuit K. A reference number 7 denotes an N-type semiconductor region of a two-phase driving type charge transferring device. A reference number 8 denotes an N$^-$-type semiconductor region having the same conductive type as the N-type semiconductor region 7 to protect a signal charge from being transferred to the reverse direction of the two-phase driving type charge transferring device. A reference number 9 denotes a reset gate electrode to which a reset pulse voltage φR is applied. A reference number 10 denotes a gate electrode to which a low voltage is applied as an output end of a body of the charge transferring device. A reference number 11 is a charge transfer electrode formed of two-layer polycrystal silicon film to which a charge transfer pulse voltage φ1 is applied. A reference number 12 is a charge transfer electrode formed of two-layer polycrystal silicon film to which charge transfer pulse voltage φ2 is applied. A reference number 13 denotes a drain power supply Vd of the detection circuit K. And, A reference number 14 denotes a signal output terminal Vout.

The charge transferring device in the embodiment is provided with a detection MOSFET 50 for detecting a signal charge and a reset MOSFET 70 for removing the signal charge after the signal charge is detected. The reset MOSFET 70 includes the floating diffusion layer 3 to which the signal charge is transferred, an N$^+$-type semiconductor region (an impurity concentration layer) 4 to which a reset voltage of the reset power supply Vrd is applied, and the reset gate electrode 9 to which a reset signal (the reset pulse voltage φR) is supplied. The detection MOSFET 50 has the gate electrode 5 connected to the floating diffusion layer 3. The detection MOSFET 50 is connected to the drain power supply Vd 13 and the signal output terminal Vout 14.

As shown in FIGS. 4A, 4B, 5 and 6, the floating diffusion layer 3 includes a first N-type semiconductor region (a first semiconductor region) 3a, second N-type semiconductor regions (second semiconductor region) 3b and a third N-type semiconductor region 3c.

The first N-type semiconductor region 3a is formed to extend from the gate electrode 10 as the output end of the body of the charge transferring device to the gate electrode 9 of the reset MOSFET 70. The first N-type semiconductor region 3a is formed not to contact the P$^+$-type semiconductor element separating region 2. The second N-type semiconductor regions 3b are provided on the both sides of the first N-type semiconductor region 3a. The second N-type semiconductor regions 3b are formed in contact with the P$^+$-type semiconductor region 2. The third N-type semiconductor region 3c is independently formed near the center of the floating diffusion layer 3 such that at least a part of the third N-type semiconductor region 3c overlaps with the first N-type semiconductor region 3a. The third N-type semiconductor region 3c is a region to be connected with the gate electrode 5 of the detection MOSFET 50 constituting the detection circuit K. In this case, the third N-type semiconductor region 3c may be formed to be connected with the second N-type semiconductor regions 3b.

In the embodiment, a depletion layer can be extended to the side of the floating diffusion layer 3. Therefore, it is possible to further reduce the capacitance between the floating diffusion layer 3 and one of the P-type semiconductor substrate 1, the P$^+$-type semiconductor region 2 surrounding the floating diffusion layer 3, the reset gate electrode 9, and the gate electrode 10. As the result of the reduction, it is possible to further reduce the floating diffusion capacitance Cfd to improve a detection sensitivity.

Operations in the embodiment will be described below.

When the level of the reset pulse voltage φR changes to a high level, a voltage of the floating diffusion layer 3 provided between the gate electrode 10 and the reset gate electrode 9 is set to a voltage of the reset power supply Vrd.

If the level of the reset pulse voltage φR changes to a low level, the floating diffusion layer 3 as one electrode of a floating capacitor is electrically separated from the other portion. At this time, the level of the charge transfer pulse voltage φ1 is low, and the level of the charge transfer pulse voltage φ2 is high. Thus, signal charges are accumulated under the charge transfer electrode 12 to which the voltage d2 is applied.

Next, when the level of the charge transfer pulse voltage φ2 changes to the low level and the level of the charge transfer pulse voltage φ1 changes to the high level, the signal charges accumulated under the charge transfer electrode 11 are transferred under the charge transfer electrode 12 to which the voltage φ2 is applied. At this time, the signal charges, accumulated under the final one 12 among charge transfer electrodes 12 of the body of the charge transferring device, flow into the floating capacitor through a channel under the gate electrode 10.

The first N-type semiconductor region 3a is formed to extend from the gate electrode 10 as the output end of the body of the charge transferring device to the reset gate electrode 9 of the reset MOSFET 70. The first N-type semiconductor region 3a is formed not to contact the P$^+$-type semiconductor region 2. An impurity concentration of the first N-type semiconductor region 3a is about 1×10$^{17}$ atoms/cm$^3$. The impurity concentration of the first N-type semiconductor region 3a is set to a value at which the first N-type semiconductor region 3a is not depleted in the voltage lower than the reset power supply voltage Vrd.

The second N-type semiconductor regions 3b are provided on the both sides of the first and third N-type semiconductor regions 3a, 3c and are formed in contact with the P$^+$-type semiconductor region 2. An impurity concentration of the second N-type semiconductor regions 3b is about 5×10$^1$ atoms/cm$^3$.

The third N-type semiconductor region 3c is independently formed near the center of the floating diffusion layer 3 such that at least a part of the third N-type semiconductor region 3c overlaps with the first N-type semiconductor region 3a. The third N-type semiconductor region 3c is the region to be connect with the gate 5 of the detection MOSFET 50 constituting the detection circuit K. An impurity concentration of the third N-type semiconductor region 3c is about 1×10$^{19}$ atoms/cm$^3$.

In the floating diffusion layer 3 having the above-mentioned structure, the first N-type semiconductor region 3a, which is not depleted in the reset power supply voltage Vrd, is formed to extend from the gate electrode 10 as the output end of the body of the charge transferring device to the reset gate electrode 9 of the reset MOSFET 70. Also, the first N-type semiconductor region 3a is formed not to contact the P+-type semiconductor region 2. Therefore, it is never depleted in the voltage lower than the reset power supply voltage Vrd.

The second N-type semiconductor regions 3b are provided on both of the sides of the first and third N-type semiconductor regions 3a, 3c, in contact with the P+-type semiconductor region 2. The second N-type semiconductor regions 3b are depleted in the voltage lower than the reset power supply voltage Vrd. Accordingly, the depletion layer can be extended to the side of the floating diffusion layer 3.

When there is a large difference between impurity concentrations (carrier concentrations) Na, Nd between N and P regions, a width d of a depletion layer is dominated by the lower impurity concentration. That is, the carrier concentration of the second N-type semiconductor regions 3b in the embodiment. The dependency of the carrier concentration of the width d of the depletion layer generated on both the N and P regions is expressed by the following equation. Wd(n) represents a width of the depletion layer of the N region, and Wd(p) represents a width of the depletion layer of the P region. Na×Wd(n)=Nd×Wd(p)

Figures 7A, 7B:
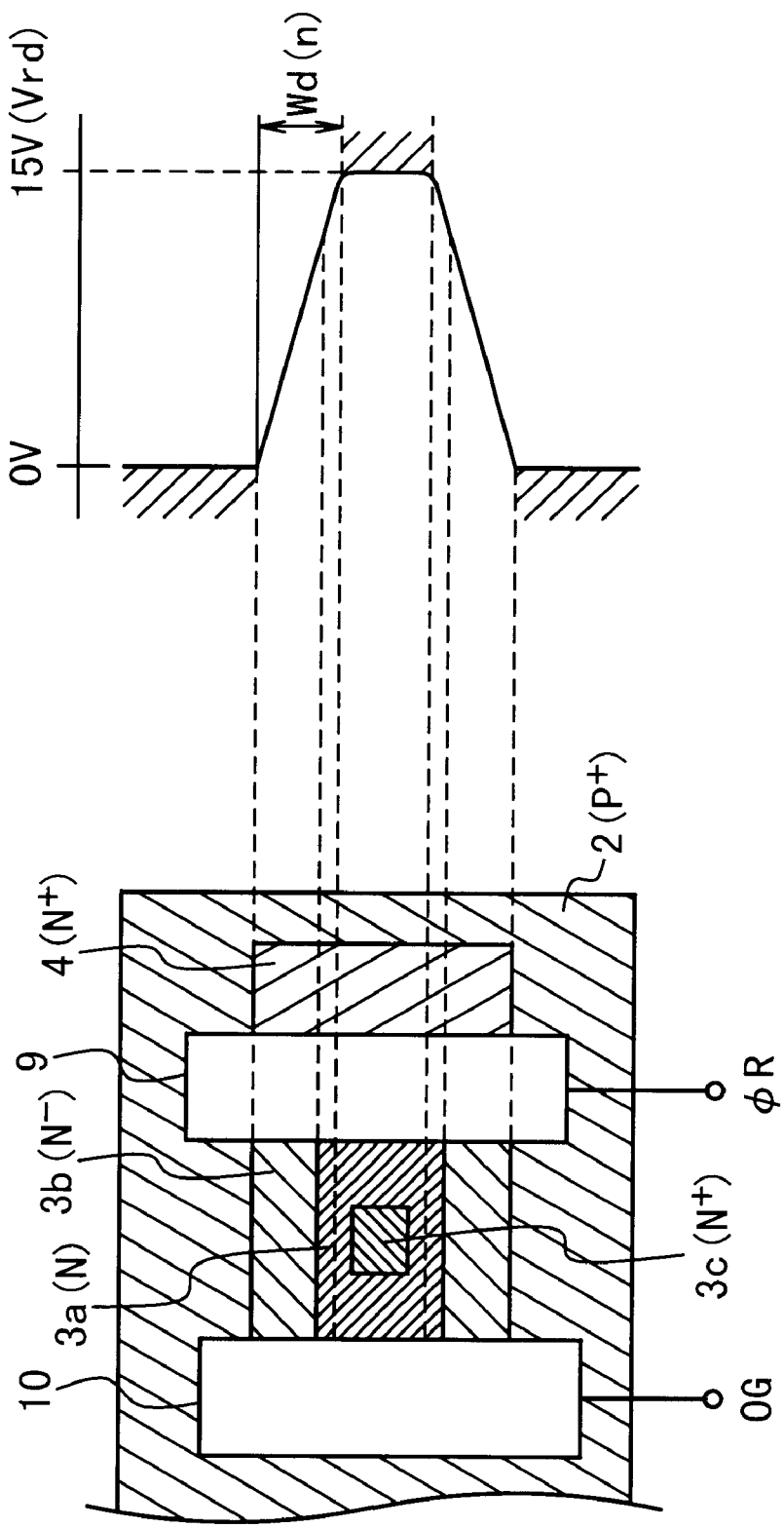
FIGS. 7A and 7B are views showing potentials in respective regions when a reset voltage is applied in FIG. 6.

A static case in which a bypass is not applied is described as mentioned above. However, in a case in which a bypass of the reset power supply voltage Vrd is applied, the width d of the depletion layer can be further extended to a central side of the floating diffusion layer 3. In the example shown in FIG. 7, the reset power supply voltage Vrd is set to be 15 V. In this case, when the level of the reset pulse voltage φR changes to the high level, a part of the first N-type semiconductor region 3a is depleted.

The impurity concentration of the first N-type semiconductor region 3a is set to be a value such that when the level of the reset pulse voltage φR changes to the high level, the entire portion of the first N-type semiconductor region 3a is not depleted. If the entire portion of the first N-type semiconductor region 3a is depleted, a channel is not provided to be conductive. The impurity concentration of the second N-type semiconductor regions 3b is set to be a value such that when the level of the reset pulse voltage φR changes to the high level, the entire portion of the second N-type semiconductor regions 3b is depleted.

That is, when the level of the reset pulse voltage φR changes to the high level and as the result, both the N+-type semiconductor region 4 to which 15 V is applied and the floating diffusion layer 3 becomes equal to each other in potential, the entire portion of the third N-type semiconductor region 3c and a part of the first N-type semiconductor region 3a are set to the potential of 15 V. However at the time, the entire portion of the second N-type semiconductor regions 3b and the other part of the first N-type semiconductor region 3a are depleted. In this way, by adjusting the impurity concentration of the first N-type semiconductor region 3a, the width Wd(n) of the depletion layer formed in the N-type region (the floating diffusion layer 3) can be expanded.

As mentioned above, if the width d of the depletion layer between the P+-type semiconductor region 2 and the second N-type semiconductor regions 3b becomes wider, a junction capacitance C between the P+-type semiconductor region 2 and the second N-type semiconductor regions 3b is further suppressed in accordance with an equation C=ε×S/d.

For the above-mentioned reason, it is possible to further reduce the capacitance between the floating diffusion layer 3 and one of the P-type semiconductor substrate 1, the P+-type semiconductor region 2 surrounding the floating diffusion layer 3, the reset gate electrode 9, and the gate electrode 10. Because of this reduction, it is possible to further reduce the floating diffusion capacitance Cfd to improve the detection sensitivity.

A method of forming the floating diffusion layer 3 in the embodiment will be described below.

At first, the second N-type semiconductor region 3b is formed by ion implantation of phosphorus. As a photo-resist used at this time, a first photo-resist is formed by using a photo-etching to have an opening whose periphery overlaps with the P+-type semiconductor region 2, the reset gate electrode 9 and the gate electrode 10. That is, the opening of the first photo-resist is larger than a rectangle region surrounded with the P+-type semiconductor region 2, the reset gate electrode 9 and the gate electrode 10, as shown in FIG. 4A. When the ion implantation of the phosphorus is performed, the first photo-resist, the P+-type semiconductor region 2, the reset gate electrode 9 and the gate electrode 10 are used as mask. The impurity concentration of the second N-type semiconductor region 3b is about 5×10$^{15}$ atoms/cm$^3$ as mentioned above.

Next, the first N-type semiconductor region 3a is formed by performing the ion implantation of the phosphorus in which a second photo-resist is used. The second photo-resist is formed to cover certain regions in the both sides of the second N-type semiconductor region 3b adjacent to the P+-type semiconductor region 2(regions shown by a symbol 3b in FIG. 4B). An opening is formed in the second photo-resist, and a part of the periphery of the opening overlaps with the reset gate electrode 9 and the gate electrode 10. When the ion implantation of the phosphorus is performed with the second photo-resist, the reset gate electrode 9 and the gate electrode 10 are used as mask. Then, the first N-type semiconductor region 3a is formed. That is, the first N-type semiconductor region 3a is formed in a part (a region except the above-mentioned certain regions) of the second N-type semiconductor region 3b by performing the ion implantation of the phosphorus in which the second photo-resist is used. Correspondingly, the impurity concentration of the first N-type semiconductor region 3a is higher. The impurity concentration of the first N-type semiconductor region 3a is about 1×10$^{17}$ atoms/cm$^3$ as mentioned above.

Next, the third N-type semiconductor region 3c is formed by performing the ion implantation of the phosphorus in which a third photo-resist is used. A minor opening is formed in the third photo-resist. The opening is formed near the center of the second N-type semiconductor regions 3b immediately after the ion implantation of the phosphorus is performed by using the first photo-resist (before the ion implantation of the phosphorus is performed by using the second photo-resist). This opening does not overlap with any of the reset gate electrode 9 and the gate electrode 10 and does not overlap with the certain regions covered by the second photo-resist. In this meaning, the opening formed in the third photo-resist is independent of the reset gate electrode 9, the gate electrode 10 and the certain regions. The third N-type semiconductor region 3c is formed near the center of the entire region of the floating diffusion layer 3 by performing the ion implantation of the phosphorus with the third photo-resist for masking.

The floating diffusion layer 3 having the structure shown in FIGS. 4A, 4B, 5 and 6 are formed by the above-mentioned processes. The second N-type semiconductor regions 3b may be formed by the following processes, instead of the above-mentioned processes. At first, the floating diffusion layer 3 is also formed to be an N-type (7) or an N⁻-type (8) respectively, simultaneously when the N-type semiconductor region 7 of the two-phase driving type charge transferring device is formed, or simultaneously when the N⁻-type semiconductor region 8 of the two-phase driving type charge transferring device is formed.

After the reset gate electrode 9 and the gate electrode 10 are formed, ion implantation of boron is performed in the floating diffusion layer 3 formed to be the N-type (7) or the N⁻-type (8). In this time, the ion implantation of boron is performed by using a photo-resist for masking a region to be the first N-type semiconductor region 3a (and the third N-type semiconductor region 3c), the P⁺-type semiconductor substrate 2, the reset gate electrode 9 and the gate electrode 10 as the mask. Accordingly, the second N-type semiconductor regions 3b are formed in which an N-type impurity concentration is lower than the first N-type semiconductor region 3a.

The masked region is still in the above-mentioned state (the N-type (7) or the N⁻-type (8)). Then, the region is defined as the first N-type semiconductor region 3a as it is. The process of forming the third N-type semiconductor region 3c after that is similar to the above-mentioned process. Moreover, the third N-type semiconductor region 3c may be formed simultaneously by the process of forming the N⁺-type semiconductor region 4 as a source region and a drain region of MOSFET.

In the embodiment, the third N-type semiconductor region 3c is provided in the floating diffusion layer 3. However, the present invention, even if the third N-type semiconductor region 3c is not provided therein, can provide a sufficient effect as compared with the related art. For example, the third N-type semiconductor region 3c is not necessary in case that the impurity concentration of the first N-type semiconductor region 3a is high to the extent that ohmic contact, with a metallic wire for the connection to the gate electrode 5 of the detection MOSFET 50, can be obtained.

The impurity concentration of the first N-type semiconductor region 3a to obtain the ohmic contact in this case is higher as compared with that of the embodiment. That leads to a defect that the floating diffusion capacitance Cfd becomes larger and the detection sensitivity is reduced. However, as mentioned above, the depletion layers extended from the second N-type semiconductor regions 3b are extended into the first N-type semiconductor region 3a. Accordingly, the floating diffusion capacitance Cfd can be reduced by the value corresponding to the extention. Therefore, this is superior to the related art.

A second embodiment will be described below with reference to FIGS. 8A, 8B, 9 and 10.

Figure 9:
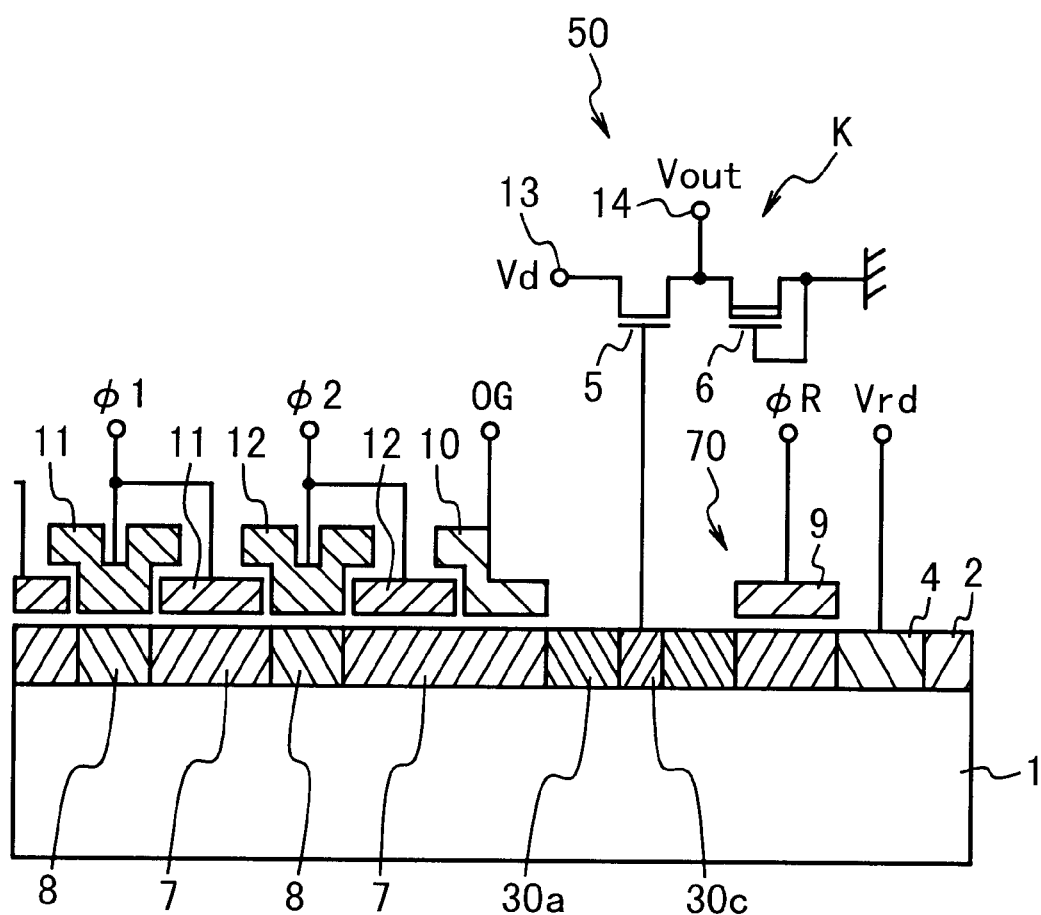
FIG. 9 is a section view taken on the line II–II' of FIG. 8A.
Figure 10:
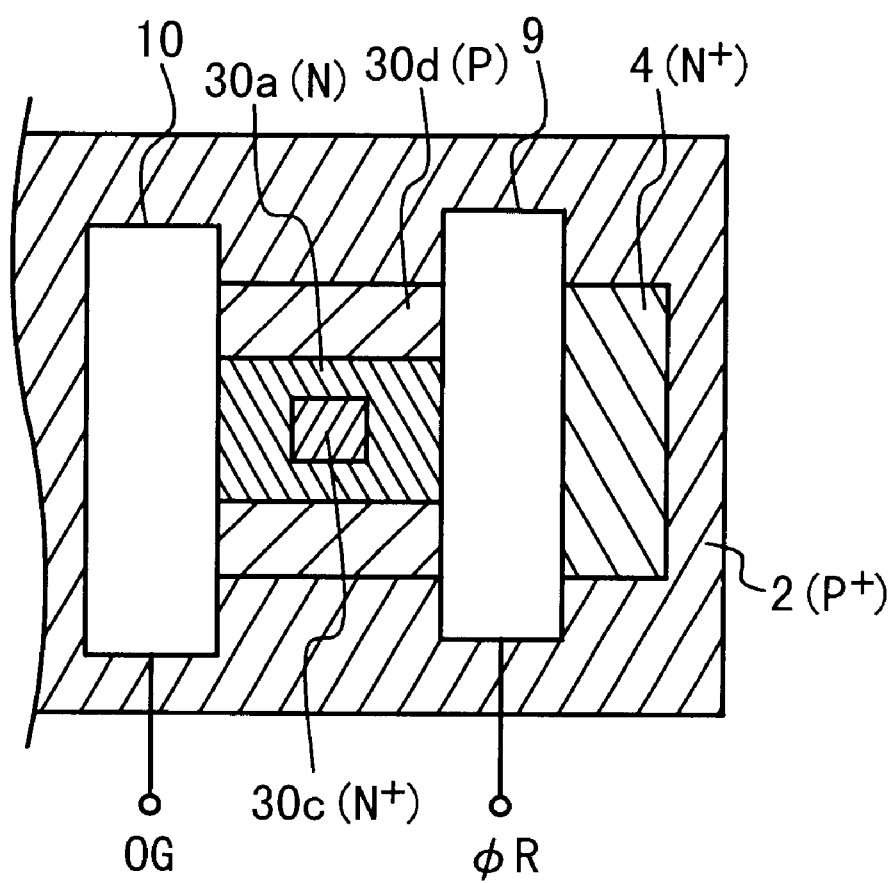
FIG. 10 is a plan section view taken on the line III–III' of FIG. 8B.

FIGS. 8A, 8B, 9 and 10 are views showing a structure of a second embodiment of the present invention. FIG. 8A is a plan view of a floating diffusion layer containing a transferring section of a charge transferring device and a reset MOSFET. FIG. 8B is a view diagrammatically showing a section taken on the line I–I' of FIG. 8A. FIG. 9 is a view diagrammatically showing a section taken on the line II–II' of FIG. 8A. FIG. 10 is a view diagrammatically showing a section taken on the line III–III' of FIG. 8B. Every reference number used in FIGS. 8A, 8B, 9 and 10 corresponds to that used in FIGS. 8A, 8B, 9 and 10.

In the second embodiment, a structure of a floating diffusion layer 30 is different from that of the floating diffusion layer (3) of the first embodiment. The floating diffusion layer 30 in the second embodiment is provided with a first N-type semiconductor region 30a, a third N-type semiconductor region 30c and a P-type semiconductor region 30d.

The first N-type semiconductor region 30a is formed to extend from the gate electrode 10 as an output end of the body of the charge transferring device to the gate electrode 9 of the reset MOSFET 70 not to contact the P⁺-type semiconductor element separating region 2. The third N-type semiconductor region 30c is independently formed near the center of the floating diffusion layer 30 such that at least a part of the third N-type semiconductor region 30c overlaps with the first N-type semiconductor region 30a. The third N-type semiconductor region 30c is a region to be connected with the gate electrode 5 of the detection MOSFET 50 constituting a detection circuit K. The P-type semiconductor regions 30d are provided on the both sides of the first N-type semiconductor region 30a. The P-type semiconductor regions 30d are formed in contact with the P⁺-type semiconductor region 2. In this case, the third N-type semiconductor region 30c may be formed to be connected with the P-type semiconductor region 30d.

The first N-type semiconductor region 30a is formed to extend from the gate electrode 10 as the output end of the body of the charge transferring device to the gate electrode 9 of the reset MOSFET 70. The first N-type semiconductor region 30a is formed not to contact the P⁺-type semiconductor element separating region 2. An impurity concentration of the first N-type semiconductor region 30a is about $1 \times 10^{17}$ atoms/cm³. The third N-type semiconductor region 30c is independently formed near the center of the floating diffusion layer 30 such that at least a part of the third N-type semiconductor region 30c overlaps with the first N-type semiconductor region 30a. The third N-type semiconductor region 30c is a region to be connected with the gate electrode 5 of the detection MOSFET 50 constituting the detection circuit K. An impurity concentration of the third N-type semiconductor region 30c is about $1 \times 10^{19}$ atoms/cm³. The P-type semiconductor regions 30d are provided on the both sides of the first and third N-type semiconductor regions 30a, 30c. The P-type semiconductor regions 30d are formed in contact with the P⁺-type semiconductor region 2. An impurity concentration of the P-type semiconductor region 30d is about $5 \times 10$ atoms/cm³.

In the floating diffusion layer 30 having the above-mentioned structure, the first N-type semiconductor region 30a which is not depleted in the reset power supply Vrd is formed to extend from the gate electrode 10 as the output end of the body of the charge transferring device to the gate electrode 9 of the reset MOSFET 70. The first N-type semiconductor region 30a is formed not to contact the P⁺-type semiconductor region 2. Therefore, the first N-type semiconductor region 30a is never depleted in the voltage lower than the reset power supply voltage Vrd.

The P-type semiconductor regions 30d, which are depleted in the voltage lower than the reset power supply voltage Vrd, are formed on both of the sides of the first and third N-type semiconductor regions 30a, 30c, in contact with the P⁺-type semiconductor region 2. Thus, the depletion layer can be extended to the side of the floating diffusion layer 30. Because of this extension, it is possible to further reduce the capacitance between the floating diffusion layer 30, and one of the P-type semiconductor substrate 1, the P⁺-type semiconductor region 2 surrounding the floating diffusion layer 30, the reset gate electrode 9 and the gate electrode 10. Associated with this reduction, it is possible to further reduce the floating diffusion capacitance Cfd to improve the detection sensitivity.

A method of forming the floating diffusion layer 30 in the second embodiment will be explained below.

At first, the P-type semiconductor region 30d is formed by ion implantation of boron. When the ion implantation of the boron is performed, a first photo-resist is used to have an opening whose periphery overlaps with the P+-type semiconductor region 2, the reset gate electrode 9 and the gate electrode 10. At this time, the P+-type semiconductor region 2, the reset gate electrode 9 and the gate electrode 10 are used as mask. That is, the opening of the first photo-resist is larger than a rectangle region surrounded with the P+-type semiconductor region 2, the reset gate electrode 9 and the gate electrode 10. The impurity concentration of the P-type semiconductor region 30d is about $5 \times 10^{15}$ atoms/cm$^3$ as mentioned above.

Next, the first N-type semiconductor region 30a is formed by performing the ion implantation of the phosphorus in which a second photo-resist is used. The second photo-resist is formed to cover certain regions in both sides of the P-type semiconductor region 30d adjacent to the P+-type semiconductor region 2 (regions shown by a symbol 30d in FIG. 8B). An opening is formed on the second photo-resist, and a part of the periphery of the opening overlaps with the reset gate electrode 9 and the gate electrode 10. The first N-type semiconductor region 30a is formed by performing the ion implantation of the phosphorus with this second photo-resist, the reset gate electrode 9 and the gate electrode 10 as the mask. That is, the first N-type semiconductor region 30a is formed on a part (a region except the above-mentioned certain regions) of the P-type semiconductor region 30d, by using the second photo-resist and then performing the ion implantation of the phosphorus which is the N-type impurity. The impurity concentration of the first N-type semiconductor region 30a is of about $1 \times 10^{17}$ atoms/cm$^3$ as mentioned above.

Next, the third N-type semiconductor region 30c is formed by performing the ion implantation of the phosphorus in which a third photo-resist is used. A minor opening is formed in the third photo-resist. The opening is formed near the center of the P-type semiconductor region 30d, immediately after the ion implantation of the boron is performed by using the first photo-resist (before the ion implantation of the phosphorus is performed by using the second photo-resist). This opening does not overlap with any of the reset gate electrode 9 and the gate electrode 10 and does not overlap with the certain regions covered by the second photo-resist. In this meaning, the opening formed in the third photo-resist is independent of the reset gate electrode 9, the gate electrode 10 and the certain regions. The third N-type semiconductor region 30c is formed near the center of the entire region of the floating diffusion layer 30, by performing the ion implantation of the phosphorus with the third photo-resist as the mask.

The floating diffusion layer 30 having the structure shown in FIGS. 8A, 8B, 9 and 10 are formed by the above-mentioned processes. The P-type semiconductor region 30d may be formed by the following processes, instead of the above-mentioned processes. At first, the floating diffusion layer 30 is also formed to be an N-type (7) or an N−-type (8),respectively, simultaneously when the N-type semiconductor region 7 of the two-phase driving type charge transferring device is formed, or simultaneously when the N−-type semiconductor region 8 of the two-phase driving type charge transferring device is formed. After the reset gate electrode 9 and the gate electrode 10 are formed, the ion implantation of boron is performed in the floating diffusion layer 30 formed to be the N-type (7) or the N−-type (8). In this time, the ion implantation of boron is performed by using a photo-resist for masking a region to be the first N-type semiconductor region 30a (and the third N-type semiconductor region 30c), the P+-type semiconductor substrate 2, the reset gate electrode 9 and the gate electrode 10 as the mask. Accordingly, the P-type semiconductor region 30d is formed. The masked region is still in the above-mentioned state (the N-type (7) or the N−-type (8)). Then, the region is defined as the first N-type semiconductor region 30a as it is. The process of forming the third N-type semiconductor region 30c after that is similar to the above-mentioned process. Moreover, the third N-type semiconductor region 30c may be formed simultaneously by the process of forming the N+-type semiconductor region 4 as a source region and a drain region of MOSFET.

In the embodiment, the third N-type semiconductor region 30c is provided in the floating diffusion layer 30. However, the present invention, even if the third N-type semiconductor region 30c is not provided therein, can provide a sufficient effect as compared with the related art. For example, the third N-type semiconductor region 30c is not necessary in case that the impurity concentration of the first N-type semiconductor region 30a is high to the extent that ohmic contact, with a metallic wire for the connection to the gate electrode 5 of the detection MOSFET 50, can be obtained.

The impurity concentration of the first N-type semiconductor region 30a to obtain the ohmic contact in this case is higher as compared with that of the embodiment. That leads to a defect that the floating diffusion capacitance Cfd becomes larger and the detection sensitivity is reduced. However, as mentioned above, the depletion layers extended from the P-type semiconductor regions 30d are extended into the first N-type semiconductor region 30a. Accordingly, the floating diffusion capacitance Cfd can be reduced by the value corresponding to the extention. Therefore, this is superior to the related art.

As explained above, according to the present invention, the depletion layer can be extended to the side of the floating diffusion layer. Thus, it is possible to further reduce the capacitance between the floating diffusion layer, and one of the P-type semiconductor substrate, the P+-type semiconductor region surrounding the floating diffusion layer, the reset gate electrode and the gate electrode. Associated with this reduction, it is possible to further reduce the floating diffusion capacitance Cfd to provide the effect of improving the detection sensitivity.

What is claimed is:

1. A charge transferring device comprising:

a detection MOSFET for detecting a signal charge; and a reset MOSFET for removing said signal charge after said signal charge is detected, wherein said reset MOSFET comprises:

a floating diffusion layer to which said signal charge is transferred;

an impurity layer to which a reset voltage is applied; and a reset gate electrode to which a reset signal is supplied, and wherein said detection MOSFET includes a detection gate electrode connected with said floating diffusion layer, and wherein said floating diffusion layer comprises:

a first semiconductor region; and
a second semiconductor region whose impurity concentration is lower that that of said first semiconductor region, and
wherein said impurity concentration of said first semiconductor region is set to a concentration such that said first semiconductor region is not depleted at a voltage lower than said reset voltage when said reset signal is supplied to said reset gate electrode,
wherein said impurity concentration of said second semiconductor region is set to a concentration such that said second semiconductor region is depleted when said reset signal is supplied to said reset gate electrode, and
wherein said first semiconductor region is provided to extend in a transfer direction of said signal charge, in said floating diffusion layer,
wherein the floating diffusion layer further comprises:
a third semiconductor region whose impurity concentration is higher than that of said first semiconductor region, and
wherein said detection gate electrode is connected with said third semiconductor region.

2. A charge transferring device according to claim 1, wherein said first semiconductor region is provided without being in contact with an element separating region; and
said second semiconductor region is provided with being in contact with said element separating region.

3. A charge transferring device according to claim 1, wherein said reset voltage is set to a value such that a part of said first semiconductor region and an entire portion of said second semiconductor region are depleted when said reset signal is supplied to said reset gate electrode.

4. A charge transferring device according to claim 1, wherein said first semiconductor region and said second semiconductor region are made of material having an opposite type of majority carrier.

5. A charge transferring device according to claim 1, wherein said first semiconductor region, said second semiconductor region and said third semiconductor region are materials having a same type of majority carrier.

6. A charge transferring device according to claim 1, wherein said first semiconductor region and said third semiconductor region are materials both having a same type of majority carrier, and wherein said second semiconductor region is a material having a majority carrier opposite to those of said first semiconductor region and said third semiconductor region.

7. The charge transferring device according to claim 1, wherein said impurity concentration of said second semiconductor region is $5 \times 10^{15}$ atoms/cm$^3$.

8. A charge transferring device comprising:
a detection MOSFET for detecting a signal charge; and
a reset MOSFET for removing said signal charge after said signal charge is detected, wherein said reset MOSFET comprises:
a floating diffusion layer to which said signal charge is transferred;
an impurity layer to which a reset voltage is applied; and
a reset gate electrode to which a reset signal is supplied, and
wherein said detection MOSFET includes a detection gate electrode connected with said floating diffusion layer, and
wherein said floating diffusion layer comprises:
a first semiconductor region; and
a second semiconductor region whose impurity concentration is lower that that of said first semiconductor region, and
wherein said impurity concentration of said first semiconductor region is set to a concentration such that said first semiconductor region is not depleted at a voltage lower than said reset voltage when said reset signal is supplied to said reset gate electrode,
wherein said impurity concentration of said second semiconductor region is set to a concentration such that said second semiconductor region is depleted when said reset signal is supplied to said reset gate electrode, and
wherein said first semiconductor region is provided to extend in a transfer direction of said signal charge, in said floating diffusion layer,
wherein said first semiconductor region and said second semiconductor region are materials having a same type of majority carrier.

9. A charge transferring device comprising:
a detection MOSFET for detecting a signal charge; and
a reset MOSFET for removing said signal charge after said signal charge is detected, wherein said resect MOSFET comprises:
a floating diffusion layer to which said signal charge is transferred;
an impurity layer to which a reset voltage is applied; and
a reset gate electrode to which a reset signal is supplied, and
wherein said detection MOSFET includes a detection gate electrode connected with said floating diffusion layer, and
wherein said floating diffusion layer comprises:
a first semiconductor region;
a second semiconductor region whose impurity concentration is lower than that of said first semiconductor region; and
a third semiconductor region whose impurity concentration is higher than that of said first semiconductor region, and
wherein said first semiconductor region is provided without being in contact with an element separating region, and is provided to extend in a transfer direction of said signal charge, in said floating diffusion layer, and an impurity concentration of said first semiconductor region is set to a concentration such that said first semiconductor region is not depleted at a voltage lower than said reset voltage when said reset signal is supplied to said reset gate electrode,
wherein said second semiconductor region is provided to be in contact with said element separating region, an impurity concentration of said second semiconductor region being set to a concentration such that said second semiconductor region is depleted when said reset signal is supplied to said reset gate electrode, and
wherein said third semiconductor region is provided near the center of said floating diffusion layer such that at least a part of said third semiconductor region overlaps with said first semiconductor region, and is connected to said detection gate electrode.

10. A charge transferring device comprising:
means for setting a floating diffusion layer to a reset potential in response to a reset signal;
means for forming a well corresponding to said reset potential in said floating diffusion layer;

means for transferring a signal charge to said well;

means for detecting said signal charge transferred to said well;

means for reducing a floating diffusion layer capacitance in said floating diffusion layer; and means for preventing said floating diffusion layer from being depleted in a potential lower than said reset potential, wherein said means for reducing said floating diffusion capacitance includes a first semiconductor region provided without being in contact with an element separating region, and a second semiconductor region which is provided to be in contact with said element separating region and whose impurity concentration is set to be lower than that of said first semiconductor region, wherein said first and second semiconductor regions are included in said floating diffusion layer, wherein said impurity concentration of said second semiconductor is set to a concentration such that said second semiconductor region is depleted, when said floating diffusion layer is set to said reset potential, and wherein said first semiconductor region is provided to extend in a transfer direction of said signal charge, in said floating diffusion layer, and wherein said floating diffusion layer further comprises a third semiconductor region whose impurity concentration is higher than that of said first semiconductor region.

11. A charge transferring device according to claim 10, wherein said impurity concentration of said first semiconductor region is set to a concentration such that said first semiconductor region is not depleted in said potential lower than said reset potential, when said floating diffusion layer is set to said reset potential.

12. A charge transferring device according to claim 10, wherein said impurity concentration of said first semiconductor region is set to a concentration such that a part of said first semiconductor region is not depleted in said potential lower than said reset potential and a remaining part of said first semiconductor region is depleted, when said floating diffusion layer is set to said reset potential.

* * * * *

UNITED STATES PATENT AND TRADEMARK OFFICE
CERTIFICATE OF CORRECTION

PATENT NO. : 6,310,933 B1
DATED : October 30, 2001
INVENTOR(S) : Yasutaka Nakashiba Page 1 of 1

It is certified that error appears in the above-identified patent and that said Letters Patent is hereby corrected as shown below:

Column 8,
Line 16, delete "4R" insert -- ØR --;
Line 28, delete "d2" insert -- Ø2 --;
Line 55, delete "$5X10^1$" insert -- $5X10^{15}$ --

Column 12,
Line 45, delete "5X10" insert -- $5X10^{15}$ --

Signed and Sealed this

Twenty-sixth Day of March, 2002

Attest:

Attesting Officer

JAMES E. ROGAN
*Director of the United States Patent and Trademark Office*